United States Patent
Orlowski et al.

(10) Patent No.: US 7,354,814 B2
(45) Date of Patent: Apr. 8, 2008

(54) SEMICONDUCTOR PROCESS WITH FIRST TRANSISTOR TYPES ORIENTED IN A FIRST PLANE AND SECOND TRANSISTOR TYPES ORIENTED IN A SECOND PLANE

(75) Inventors: Marius K. Orlowski, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 215 days.

(21) Appl. No.: 10/949,057

(22) Filed: Sep. 23, 2004

(65) Prior Publication Data
US 2006/0063320 A1 Mar. 23, 2006

(51) Int. Cl.
*H01L 21/8238* (2006.01)
*H01L 21/336* (2006.01)
(52) U.S. Cl. .................. 438/199; 438/268; 438/270
(58) Field of Classification Search ............ 438/199, 438/268, 138, 270, 271, 272
See application file for complete search history.

(56) References Cited

U.S. PATENT DOCUMENTS

| 4,857,986 | A | 8/1989 | Kinugawa |
| 6,500,727 | B1 * | 12/2002 | Chen et al. ............ 438/424 |
| 6,639,275 | B2 | 10/2003 | Ninomiya |
| 2002/0098655 | A1 * | 7/2002 | Zheng et al. ............ 438/268 |
| 2002/0185675 | A1 * | 12/2002 | Furukawa ............ 257/327 |
| 2002/0185676 | A1 * | 12/2002 | Momose ............ 257/327 |
| 2004/0157353 | A1 * | 8/2004 | Ouyang et al. ............ 438/38 |

OTHER PUBLICATIONS

Kinugwa et al.; Submicron 3D Surface Orientation Optimized CMOS Technology, VLSI Symp Digest, p. 17, 1986.
Mori et al.; Sub-100nm Vertical MOSFET with Threshold Voltage Adjustment; IEEE ED 49, p. 61, 2002.
Schulz et al.; Short-Channel Vertical Sidewall MOSFETs; IEEE ED 48, p. 1783, 2001, IEDM 98, p. 939.
Liu et al; A Novel Sidewall Strained-Si Channel nMOSFET; IEDM 1999, p. 63.

* cited by examiner

*Primary Examiner*—Michael Trinh

(57) ABSTRACT

A semiconductor fabrication process includes forming a recess in a semiconductor substrate. A silicon germanium film is formed on a sidewall of the recess. A gate dielectric and gate electrode are formed adjacent the silicon germanium film. Source/drain regions are then formed wherein a first source/drain region is adjacent a first side of the gate electrode in an upper surface of the substrate and a second source/drain region adjacent a second side of the gate electrode is below a lower surface of the recess. Etching the exposed portion of the substrate may be done so as to form a rounded corner at the junction of the recess sidewall and the recess lower surface. The silicon germanium film formation is preferably epitaxial. An epitaxial silicon film may be formed adjacent the silicon germanium film.

12 Claims, 2 Drawing Sheets

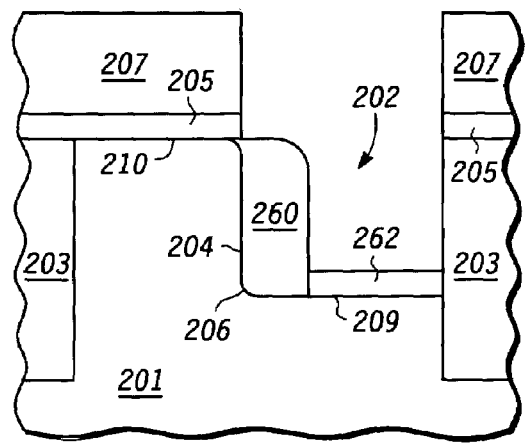
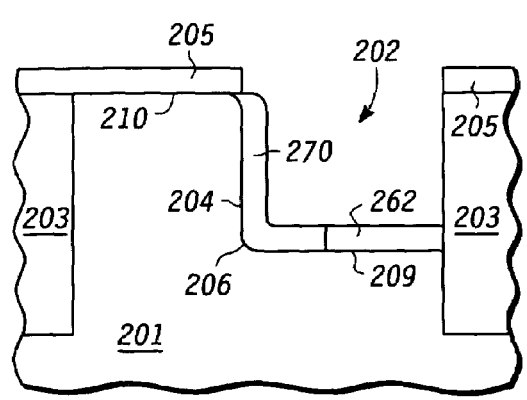
FIG. 7    FIG. 8
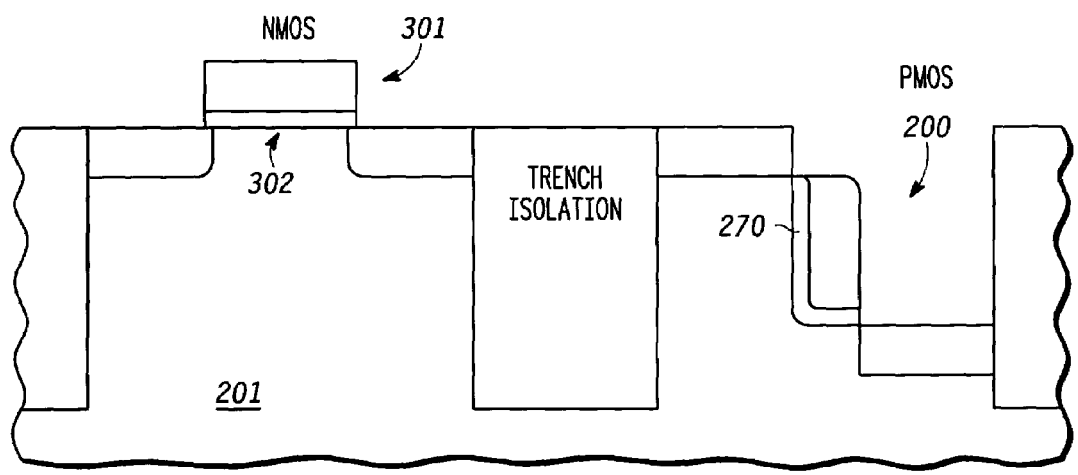
FIG. 9

SEMICONDUCTOR PROCESS WITH FIRST TRANSISTOR TYPES ORIENTED IN A FIRST PLANE AND SECOND TRANSISTOR TYPES ORIENTED IN A SECOND PLANE

FIELD OF THE INVENTION

The present invention is in the field of semiconductor fabrication processes and, more particularly CMOS processes.

RELATED ART

In conventional CMOS fabrication, the physical structures of the NMOS and PMOS transistors are the same. Both types of transistors are typically formed in the upper surface of a wafer by defining a conductor transistor gate overlying a thin oxide layer and implanting or otherwise depositing conductive areas in the wafer upper surface displaced on either side of the gate. The distinction between NMOS and PMOS transistors is achieved by appropriate doping of the respective transistor elements.

In the conventional process referred to above, the process designer specifies certain parameters or characteristics with knowledge that the two types of transistors exhibit different and potentially conflicting properties with respect to the parameter. The crystalline orientation of the wafer, for example, affects NMOS and PMOS transistors differently. It is known that carrier mobility is an important factor in determining the performance of an MOS transistor. It is also known that, other things being equal, electron mobility is greatest in the (100) plane of a wafer while hole mobility is greatest in the (110) plane. In conventional processing, one of these planes was chosen and other parameters were adjusted to accommodate the type of transistor adversely affected by the orientation. It would be desirable, however, to implement a fabrication process in which each type of transistor could be formed in the most advantageous crystalline plane.

Similarly, the starting material of the wafer and, more particularly, the material comprising the transistor channel region, is a process parameter that affects NMOS and PMOS transistors differently. Silicon has been, of course, the predominant starting material for four decades. Hole mobility, however, is greater in other types of materials including, for example, compressively stressed silicon germanium (c-SiGe). It would be desirable to implement a fabrication process in which the channel material for NMOS transistors exhibits favorable electron mobility characteristics and the channel material for PMOS transistors exhibits favorable hole mobility characteristics.

BRIEF DESCRIPTION OF THE DRAWINGS

The present invention is illustrated by way of example and not limited by the accompanying figures, in which like references indicate similar elements, and in which:

FIG. 7 depicts processing subsequent to FIG. 1 in which a dielectric spacer is formed and an oxide layer is subsequently deposited over portions of the substrate not covered by the dielectric spacer;

FIG. 8 depicts processing subsequent to FIG. 7 in which a selective silicon germanium film is formed; and FIG. 9 depicts the integration of the transistors formed in FIGS. 1-8 with conventional transistors.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the present invention permits the formation of PMOS transistors exhibiting enhanced hole mobility and NMOS transistors exhibiting enhanced electron mobility. The hole mobility of the PMOS transistors is enhanced by orienting the PMOS transistor channel in the (110) plane and by using compressively stressed silicon germanium for the transistor channel. The electron mobility of the NMOS transistor is enhanced by using silicon as the channel material and orienting the NMOS transistor channel in a (100) plane of the wafer. The invention encompasses a CMOS process characterized by sidewall PMOS transistors and planar (conventional) NMOS transistors where the PMOS transistor channels lie in a (110) plane of a (100) wafer. Alternatively, the CMOS process may employ sidewall NMOS transistors and planer PMOS transistors wherein the NMOS transistor channels line in a (100) plane of a (110) wafer. Because an embodiment in which the starting material (wafer) is a (100) silicon wafer is more easily integrated into existing CMOS processes (which also use (100) silicon wafers as the starting material), the figures below depict an embodiment in which the PMOS transistors are fabricated as sidewall transistors oriented in a (110) plane of the wafer and the NMOS transistors are more conventional or planar transistors in which the channel region lies in the same plane as the upper surface of the substrate (the (100) plane). As will be discussed below following the description of the figures, however, the invention encompasses a "reverse" implementation in which the starting material (or at least an upper portion of the starting material) is (110), the NMOS transistors are sidewall transistors oriented in the (100) plane and the PMOS transistors are planar transistors.

Figure 1:
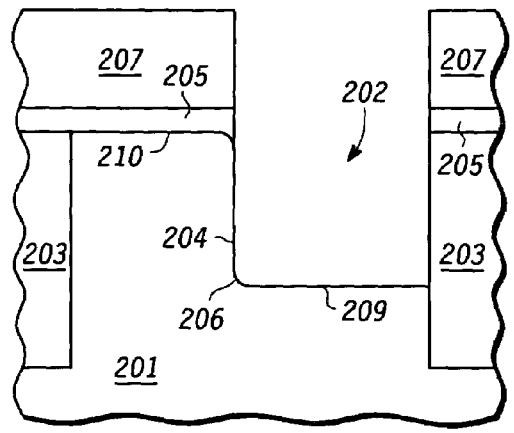
FIG. 1 is a partial cross-sectional view of a semiconductor wafer in which a trench has been formed.

Referring now to the drawings, FIG. 1 is a partial cross-sectional view of a wafer 201 at an early stage in the formation of a transistor 200 according to one embodiment of the present invention. In the depicted embodiment, isolation dielectric structures 203 have been formed in the wafer. A hard mask including a silicon nitride layer 207 over a silicon oxide layer 205 has been patterned and used to form a trench or recess 202 in an upper surface 210 of wafer 201. The depth of trench 202 controls the length of the transistor 200 to be formed. Formation of trench 202 is achieved using conventional masking and silicon etch techniques. Because the depth of trench 202 is determined by an etch process, the length of the resulting transistor 200 is not controlled by a photolithography process, which may be advantageous in the formation of short channel devices (devices having a length of less than approximately 200 nm).

The upper surface 210 of wafer 201 preferably lies in a (100) plane of the wafer while a sidewall 204 of trench 202 lies in a (110) plane of wafer 201. In one embodiment of the invention, transistors of a first type will be formed with their channel regions oriented in the (100) plane and transistors of a second type will be formed with their channel regions oriented in the (110) plane. Moreover, because hole mobility is enhanced in the (110) plane, the preferred embodiment forms PMOS transistors with their channel regions oriented in the (110) plane and NMOS transistors oriented in the (100). Because the formation of NMOS transistors in the (100) is well known, the focus of this disclosure is on the formation of the (110)-oriented transistors (i.e., the PMOS transistors). The NMOS transistors are discussed in FIG. 9 with respect to the integration of the conventionally formed NMOS transistors with the "vertically-oriented" PMOS devices.

In FIG. 1, a corner 206 results from the formation of trench 202. In one embodiment, the formation of trench 202 is controlled to produce a corner 206 that is rounded. The transistor 200 to be formed in wafer 201 has a channel region that is primarily confined to the sidewall 204 of trench 202, but which will also have a small portion extending along the bottom of trench 202 to contact a source/drain region. The resulting channel region, therefore conforms to the shape of trench 202. A rounded corner 206 thus results in a rounded transistor channel region, which is believed to exhibit a more uniform inversion strength than a "right angle" channel. A rounded corner 206 is achieved by controlling the parameters of the silicon etch that produces trench 202 using techniques that are familiar to those knowledgeable in dry etch processing.

Figure 2:
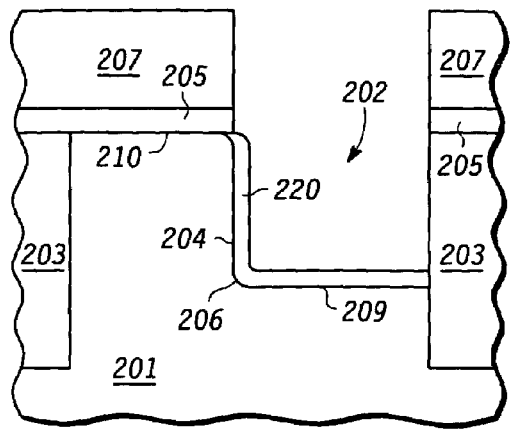
FIG. 2 depicts processing subsequent to FIG. 1 in which silicon germanium is formed overlying the wafer substrate.

Two embodiments of the invention are described herein, namely, a non-selective embodiment (FIGS. 1 through 6) and a selective embodiment (FIGS. 7-8). The selective and non-selective descriptors refer to the manner in which an epitaxial film is formed on the silicon recesses. In the non-selective embodiment shown in FIG. 2, an epitaxial film 220 is formed on the sidewalls 204 and lower surface 209 of each silicon recess 202. In the preferred embodiment, epitaxial film 220 is a silicon germanium film formed, as its names suggests, by epitaxial growth or deposition. Epitaxial formation ensures continuity between the crystalline structure of wafer 201 and the resulting epitaxial film 220.

The use of silicon germanium as the material formed on sidewalls 204 of silicon recesses 202 is advantageous for PMOS transistors. Specifically, it is known that the lattice constant difference between silicon germanium and silicon results in the silicon germanium film being compressively stressed as formed on the silicon sidewall. It is also known that hole mobility for compressively stressed silicon germanium (c-silicon germanium) is greater than the hole mobility in silicon. In the terminology of this disclosure, c-silicon germanium exhibits enhanced hole mobility. The epitaxial c-silicon germanium adjacent sidewalls 204 will serve as the channel region of the resulting transistor 200. By employing c-silicon germanium for the channel region and orienting the channel region in the (110) plane, the present invention achieves improved performance for PMOS transistors.

Figure 3:
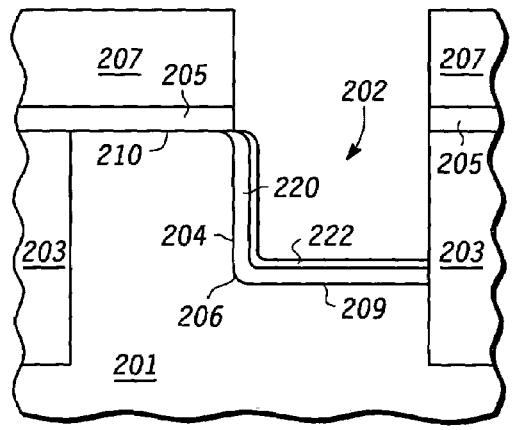
FIG. 3 depicts processing subsequent to FIG. 2 in which an optional silicon film is formed overlying the silicon germanium.

Turning to FIG. 3, an optional processing step in the formation of transistor 200 is shown. In this step, a thin epitaxial silicon film 222 is formed on the underlying c-silicon germanium film 220. This film is beneficial for embodiments in which the subsequently formed gate dielectric film is a silicon-oxide compound because of reduced imperfections in the dielectric interface. For embodiments using gate dielectrics such as a variety of metal-oxide compounds, the silicon epitaxial film 222 may be eliminated to simplify the process flow.

Figure 4:
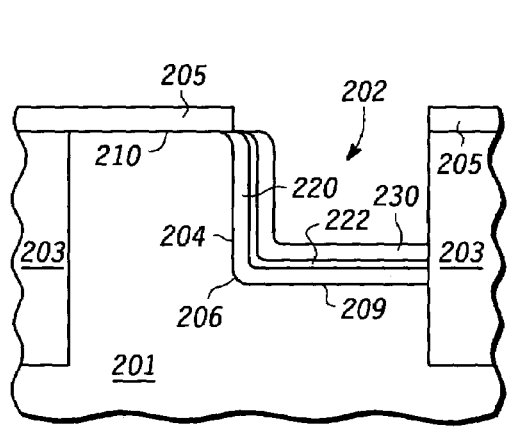
FIG. 4 depicts processing subsequent to FIG. 3 in which a gate dielectric is formed adjacent the silicon germanium film.

In FIG. 4, silicon nitride layer 207 has been removed and a gate dielectric film 230 has been formed on epitaxial film 222 or, if film 222 is omitted, epitaxial film 220. Gate dielectric film may be a thermally formed silicon-oxide, a decoupled plasma nitridation (DPN) oxynitride, a deposited metal-oxide compound such as $HfO_2$, or another suitable dielectric material. An effective oxide thickness (EOT) of gate dielectric film is preferably in the range of approximately 10 to 200 angstroms.

Figure 5:
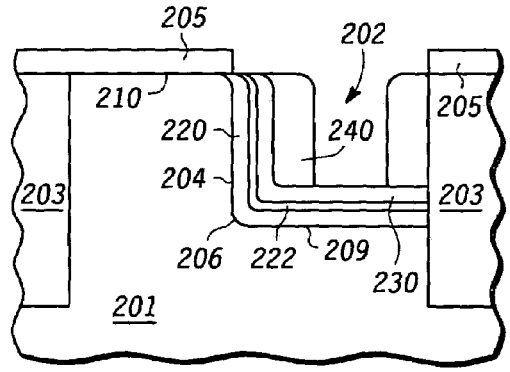
FIG. 5 depicts processing subsequent to FIG. 4 in which the transistor gate electrode is formed.

Referring to FIG. 5, following the formation of gate dielectric 230, a gate electrode 240 is formed on and adjacent gate dielectric layer 230. Gate electrode 240 may be a conventional polycrystalline silicon (polysilicon) formed by thermal decomposition of silane or another suitable process. In other embodiments, a metal or metal compound may be used for gate electrode 240. Gate electrode 240 is formed by first depositing a conformal gate electrode film of polysilicon, metal, metal compound or the like. The gate electrode film is then etched anisotropically to form the gate electrode 240. Thus, gate electrode 240 is a spacer structure formed on sidewalls 204 of recess 202 Gate electrode 240 covers the sidewall 204 of silicon recess 202 and a first portion of the lower surface 209 of silicon recess 202 while leaving a second portion of lower surface 209 uncovered.

Figure 6:
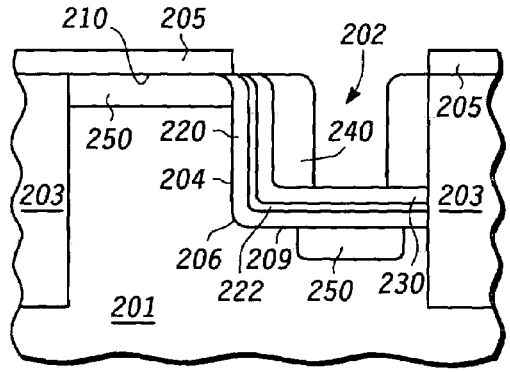
FIG. 6 depicts processing subsequent to FIG. 5 in which source/drain regions are formed.

Referring to FIG. 6, gate electrode 240 is used as a mask for a subsequent source/drain implant that results in the formation of source/drain regions 250. Specifically, a first source/drain region 250 is formed adjacent a first side of gate electrode 240 within the substrate 201 proximal to the upper surface 210 of substrate 201 and a second source/drain region 250 is formed adjacent a second side of gate electrode 240 in substrate 201 proximal to a lower surface 209. The boundaries of the second source/drain region are defined by the portion of lower surface 209 not covered by gate electrode 240. In an embodiment in which transistor 200 is a PMOS transistor, source/drain areas 250 are heavily doped with a p-type impurity such as boron.

Those familiar with field effect transistors will recognize that FIG. 6 depicts a sidewall transistor 200. Transistor 200 includes the gate electrode 240, the gate dielectric film 230, the c-silicon germanium epitaxial layer 220, and the source/drain regions 250. The source/drain regions 250 are positioned on either side of gate electrode 240 and vertically displaced from one another by the depth of silicon recess 202. The c-silicon germanium epitaxial film 220 serves as the transistor channel region, which is oriented in the (110) plane of wafer 201. When gate electrode 240 is biased appropriately, a conductive channel is formed within epitaxial layer 220 thereby providing an electrical connection between the vertically displaced source/drain regions 250.

Referring now to FIG. 7, processing subsequent to FIG. 1 according to a second embodiment of the invention is depicted to illustrate selective formation of the epitaxial c-silicon germanium film. In FIG. 7, a silicon nitride spacer 260 is formed on side wall 204 of recess 202. Following formation of silicon nitride spacer 260, an oxide film 262 is deposited over the portion of lower surface 209 of recess 202 not covered by silicon nitride spacer 260 (note that a mirror image nitride spacer formed on the sidewall of isolation region 203 is not shown for the sake of simplicity).

Referring to FIG. 8, silicon nitride spacer 260 (and silicon nitride film 207) have been removed and a selective epitaxial film 270 of silicon germanium has been grown adjacent sidewall 204. The remaining processing is substantially equivalent to the processing shown in FIGS. 3, 4, and 5. Specifically, a silicon epitaxial film may be formed (optionally) followed by the formation of a gate dielectric and a gate electrode. The gate electrode preferably has approximately the same dimensions as the silicon nitride spacer 260 so that the resulting gate electrode will just cover the selective epitaxial film 270. Following formation of the gate electrode, source/drain regions are formed using the gate electrode as a mask.

The selective formation of epitaxial film 270 shown in FIG. 8 enjoys the benefit of limiting the resulting c-silicon germanium film to the channel region of the transistor. Comparing the silicon germanium film 220 formed in the non-selective embodiment shown in FIG. 2, it is seen that non-selective film 220 extends over a portion of substrate 201 into which a source/drain region 250 will be formed. This structure, although somewhat simpler to manufacture has asymmetric source/drain properties. Specifically, the source/drain region 250 formed proximal to upper surface 210 is not covered by silicon germanium while the source/drain region 250 formed proximal to lower surface 209 of trench 202. This asymmetry may result in parameters such as source/drain contact resistance having two distinct sets of values, one value where no epitaxial film is formed and one value for where the epitaxial film is present. The selective epitaxial process of FIGS. 7 and 8, in contrast eliminates this asymmetry while maintaining the benefits of using c-silicon germanium for the transistor channel region.

Referring now to FIG. 9, an integrated circuit 300 according to one embodiment of the present invention is shown as including a sidewall transistor 200 as described above integrated with a second and more conventional or planar transistor 301. Whereas transistor 200 has a c-silicon germanium channel region 270 oriented perpendicular to an upper surface of substrate 201, transistor 301 has a silicon channel region 302 that is oriented parallel to the substrate upper surface. Transistor 301 is a planar transistor that will be recognizable to those skilled in semiconductor fabrication. In one embodiment, transistor 200 represents the PMOS transistors of integrated circuit 300 while transistor 301 represents the NMOS transistors. In this embodiment, both types of transistors are fabricated from a common substrate 201 and each employs a channel region oriented and made of a material exhibiting favorable carrier mobility characteristics.

FIG. 1 through FIG. 9 above illustrate a process in which the channel regions of the PMOS transistors are of a second material (c-silicon germanium) and lie in a second plane (110) of a substrate comprised of a first material (silicon) and having an upper surface lying in a (100) plane. This embodiment is advantageous for PMOS transistors because the second material and the second plane both exhibit enhanced hole mobility. Similarly, the NMOS transistors of this embodiment have channel regions comprised of the first material and lying in the first plane, which both exhibit enhanced electron mobility.

It will be appreciated by those skilled in semiconductor fabrication having the benefit of this disclosure, however, that an alternative embodiment could include NMOS transistors having channel regions comprised of a second material (e.g., silicon or silicon carbide) lying in a second plane (the (100) plane) of a (110) wafer substrate comprised of a first material (silicon germanium). In this embodiment, the NMOS transistors would be fabricated as the sidewall transistors while the PMOS transistors are fabricated as the planar transistors. The wafer substrate 201, in this embodiment, is preferably a (110) silicon germanium top layer of an SOI (semiconductor-on-insulator) wafer and the epitaxial channel film is silicon, silicon carbide, or another material that exhibits tensile stress as deposited on silicon germanium. In this embodiment, the transistor channel material and orientation of the sidewall NMOS transistors exhibit enhanced electron mobility.

Thus, in both embodiments, a second (sidewall) transistor is formed having a channel region comprised of a second material and lying in a second plane of a wafer substrate comprised of a first material, where the upper surface of the substrate lies in a first plane. In both embodiments, the first plane and the first material exhibit enhanced carrier mobility for a first type of carrier (hole or electron) while the second plane and the second material exhibit enhanced carrier mobility for a second type of carrier.

In the foregoing specification, the invention has been described with reference to specific embodiments. However, one of ordinary skill in the art appreciates that various modifications and changes can be made without departing from the scope of the present invention as set forth in the claims below. For example, whereas the source/drain implants used to form source/drain regions 250 is performed after formation of the gate electrode 240, another embodiment might implant the source/drain prior to gate electrode formation. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, comprising:
   forming a recess in a semiconductor substrate;
   growing a silicon germanium film epitaxially on a sidewall of the recess, wherein growing the silicon germanium film comprises forming the silicon germanium film selectively on a recess sidewall and a first portion of a lower surface of the recess;
   forming a gate dielectric film adjacent the silicon germanium film;
   forming a gate electrode adjacent the gate dielectric film;
   forming a first source/drain region adjacent a first side of the gate electrode in an upper surface of the semiconductor substrate and a second source/drain region adjacent a second side of the gate electrode below the lower surface of the recess; and
   wherein prior to forming the silicon germanium film:
      forming a silicon nitride spacer structure adjacent the recess sidewall wherein the silicon nitride spacer covers the first portion of the lower surface of the recess and exposes a second portion of the lower surface of the recess;
      depositing an oxide over the second portion of the lower surface of the recess; and removing the silicon nitride spacer to expose the recess sidewall and the first portion of the lower surface of the recess.

2. The method of claim 1, wherein forming the recess includes:
forming a silicon nitride layer overlying the substrate;
patterning the silicon nitride layer to expose a portion of the substrate; and
etching the exposed portion of the substrate with a silicon etch process.

3. The method of claim 2, wherein etching the exposed portion of the substrate comprises etching the exposed portion of the substrate to form a rounded corner at the junction of the recess sidewall and the lower surface of the recess.

4. The method of claim 1, further comprising, after growing the silicon germanium film and prior to forming the gate dielectric, forming an epitaxial silicon film adjacent the silicon germanium film.

5. The method of claim 1, wherein forming the gate dielectric comprises forming an oxynitride film using a decoupled plasma nitridation process.

6. The method of claim 1, wherein forming the gate electrode comprises forming a gate electrode spacer structure adjacent the gate dielectric film wherein the gate electrode covers the recess sidewall and the first portion of the lower surface of the recess.

7. A semiconductor fabrication process, comprising:
forming a recess in a semiconductor substrate;
growing a silicon germanium film epitaxially on a sidewall of the recess, wherein growing the silicon germanium film comprises forming the silicon germanium film selectively on a recess sidewall and a first portion of a lower surface of the recess;
forming a gate dielectric film adjacent the silicon germanium film, wherein forming the gate dielectric comprises forming a metal oxide gate dielectric;
forming a gate electrode adjacent the gate dielectric film;
forming a first source/drain region adjacent a first side of the gate electrode in an upper surface of the semiconductor substrate and a second source/drain region adjacent a second side of the gate electrode below the lower surface of the recess; and
wherein prior to forming the silicon germanium film:
forming a silicon nitride spacer structure adjacent the recess sidewall wherein the silicon nitride spacer covers the first portion of the lower surface of the recess and exposes a second portion of the lower surface of the recess;
depositing an oxide over the second portion of the lower surface of the recess; and
removing the silicon nitride spacer to expose the recess sidewall and the first portion of the lower surface of the recess.

8. The method of claim 7, wherein forming the recess includes:
forming a silicon nitride layer overlying the substrate;
patterning the silicon nitride layer to expose a portion of the substrate; and
etching the exposed portion of the substrate with a silicon etch process.

9. The method of claim 8, wherein etching the exposed portion of the substrate comprises etching the exposed portion of the substrate to form a rounded corner at the junction of the recess sidewall and the lower surface of the recess.

10. The method of claim 7, further comprising, after growing the silicon germanium film and prior to forming the gate dielectric, forming an epitaxial silicon film adjacent the silicon germanium film.

11. The method of claim 7, wherein forming the gate dielectric comprises forming an oxynitride film using a decoupled plasma nitridation process.

12. The method of claim 7, wherein forming the gate electrode comprises forming a gate electrode spacer structure adjacent the gate dielectric film wherein the gate electrode covers the recess sidewall and the first portion of the lower surface of the recess.

* * * * *